(12) United States Patent
Kim

(10) Patent No.: US 11,772,232 B2
(45) Date of Patent: Oct. 3, 2023

(54) GRINDING EQUIPMENT

(71) Applicant: AM TECHNOLOGY CO., LTD., Asan-si (KR)

(72) Inventor: Hyoung Joo Kim, Asan-si (KR)

(73) Assignee: AM TECHNOLOGY CO., LTD., Asan-si (KR)

( * ) Notice: Subject to any disclaimer, the term of this patent is extended or adjusted under 35 U.S.C. 154(b) by 612 days.

(21) Appl. No.: 16/761,266

(22) PCT Filed: Oct. 26, 2018

(86) PCT No.: PCT/KR2018/012857
§ 371 (c)(1),
(2) Date: May 4, 2020

(87) PCT Pub. No.: WO2019/088600
PCT Pub. Date: May 9, 2019

(65) Prior Publication Data
US 2020/0282510 A1 Sep. 10, 2020

(30) Foreign Application Priority Data
Nov. 3, 2017 (KR) .................... 10-2017-0145967

(51) Int. Cl.
*B24B 37/30* (2012.01)
*H01L 21/683* (2006.01)
(52) U.S. Cl.
CPC .......... *B24B 37/30* (2013.01); *H01L 21/6838* (2013.01)

(58) Field of Classification Search
CPC ..... B24B 41/06; B24B 41/067; B24B 41/068; B24B 37/34; B24B 37/345; H01L 21/683;
(Continued)

(56) References Cited

U.S. PATENT DOCUMENTS 3,740,900 A * 6/1973 Youmans ................ B24B 37/27
269/21
2018/0254196 A1* 9/2018 Ishii ...................... H01L 21/461

FOREIGN PATENT DOCUMENTS

JP 61-076270 A 4/1986
JP 07-040240 A 2/1995
(Continued)

OTHER PUBLICATIONS

International Search Report for PCT/KR2018/012857 dated Feb. 11, 2019 from Korean Intellectual Property Office.

*Primary Examiner* — Joel D Crandall
*Assistant Examiner* — Abbie E Quann
(74) *Attorney, Agent, or Firm* — Revolution IP, PLLC

(57) ABSTRACT

A grinding equipment includes: a frame which has a central shaft disposed collinearly to one side of the polishing wheel and rotates about the central shaft; a plurality of seating portions which are disposed on the upper side of the frame, each have a space formed in the central portion thereof, seat a workpiece on the upper surfaces thereof, and are arranged radially from the central shaft of the frame; a plurality of vacuum portions which are disposed in the central portions of the plurality of seating portions respectively, seat the workpiece on the upper surfaces thereof, and each have a plurality of flow channels so as to secure the workpiece by suctioning air through the flow channels; and a control unit for controlling the rotation of the frame.

4 Claims, 4 Drawing Sheets

(58) Field of Classification Search
CPC ........... H01L 21/6838; H01L 21/68771; H01L 21/68778; H01L 21/68785; B23Q 3/061; B23Q 3/088
USPC ................................................ 451/388, 289
See application file for complete search history.

(56) References Cited

FOREIGN PATENT DOCUMENTS

| | | | |
|---|---|---|---|
| JP | 07-088760 A | | 4/1995 |
| JP | 10-138071 A | | 5/1998 |
| JP | 2002-210624 A | | 7/2002 |
| JP | 2012-101293 A | | 5/2012 |
| JP | 2012101293 A | * | 5/2012 |
| KR | 10-1675271 B1 | | 11/2016 |

* cited by examiner

GRINDING EQUIPMENT

TECHNICAL FIELD

The present invention relates to a grinding equipment, and particularly, to a grinding equipment that improves polishing efficiency by stably fixing a workpiece.

BACKGROUND

In general, a semiconductor package is manufactured by manufacturing a semiconductor chip on which a circuit is formed such as a transistor and a capacitor on a semiconductor substrate made of silicon, and then attaching it to a strip material such as a lead frame or a printed circuit board. In other words, the semiconductor package is electrically connected with a wire or the like so that the semiconductor chip and the strip material pass through each other, and can be manufactured through a process of molding the semiconductor chip with an epoxy resin to protect it from the external environment.

The strip material as described above is subjected to a polishing process, which is a mechanical and chemical polishing process for reducing the thickness. In other words, the strip material can be grinded to a desired thickness so as to be a strap in contact with the strip member by rotating a grinding wheel disposed on the upper portion of the strip.

As a grinding equipment for polishing a conventional strip as described above, Korean Patent Registration No. 10-1675271 is disclosed.

However, the above-described conventional grinding equipment is configured to polish one strip material in one process, and thus has a disadvantage in that manufacturing efficiency is deteriorated by performing repeated polishing processes to polish a plurality of strips. In addition, since the conventional grinding equipment performs a polishing process by rotating only a polishing wheel in a state where the strip is fixed, it is difficult to apply the grinding equipment due to a limit to the fixing force to fix the strip provided in a rotating frame. Therefore, there is a problem that when the conventional strip grinding equipment is applied to the rotating frame, the strip is not stably fixed, so that the strip may be detached or moved during the polishing process, thereby deteriorating the polishing efficiency.

Moreover, when the conventional grinding equipment is configured to polish a plurality of strips, since the strips disposed at the center of the frame are polished through the edges of the polishing wheel, so that the surface is not uniformly polished due to the difference in speed of polishing, which may cause the production of defective products.

SUMMARY OF INVENTION

Technical Problem

An object of an embodiment of the present invention is to provide a grinding equipment which stably fixes a plurality of rotating workpieces and improves polishing efficiency by providing a uniform polishing speed to the workpieces.

Solution to Problem

A grinding equipment according to the present invention for achieving the above object which is disposed below a polishing wheel so as to polish the surface of a workpiece, the grinding equipment includes a frame which has a central shaft disposed collinearly to one side of the polishing wheel and rotates about the central shaft; a plurality of seating portions which are disposed on the upper side of the frame, each have a space formed in the central portion thereof, seat a workpiece on the upper surfaces thereof, and are arranged radially from the central shaft of the frame; a plurality of vacuum portions which are disposed in the central portions of the plurality of seating portions respectively, seat the workpiece on the upper surfaces thereof, and each have a plurality of flow channels so as to secure the workpiece by suctioning air through the flow channels; and a control unit for controlling the rotation of the frame.

Here, the plurality of seating portions may be spaced apart from each other at the same distance along the outer circumference of the frame on the upper side of the frame.

In addition, the vacuum portion may include a vacuum frame which is disposed on the central portion of the seating portion, the workpiece is seated on the upper surface, and includes a plurality of flow channels, a vacuum pump which is connected to the flow channel and enables the flow channel in a vacuum state, and a vacuum control unit which controls the vacuum pump.

In addition, the grinding equipment of the present invention may further include a lip seal part which is interposed between the seating portion and the vacuum portion, in which an upper end protrudes to one side and the workpiece is seated on the upper surface.

Here, the lip seal part may be provided along the outer circumference of the vacuum frame and formed roundly to protrude from the upper end to one side.

Advantageous Effects

According to an embodiment of the present invention, in the grinding equipment according to the present invention, since a plurality of vacuum portions can fix a plurality of workpieces respectively, it is possible to fix and remove the plurality of workpieces without a separate bonding process, and since each of the plurality of workpieces can be fixed and removed individually from the frame, manufacturing efficiency is high.

In addition, since the difference in polishing speed applied to the workpiece is minimized, the occurrence of surface patterns due to the speed difference is prevented, and uniform polishing is possible by arranging radially the plurality of seating portions on the basis of the central shaft of the frame, it is possible to reduce the production of defective products.

In addition, since a lip seal part is interposed between the seating portion and the vacuum portion, the vacuum force of a vacuum frame is increased, and since fixing force by which the workpiece is fixed to the seating portion is improved by being the workpiece in close contact with the seating portion by increasing a contact area between the upper surface of the lip seal part and the workpiece, it is possible to improve polishing efficiency.

DETAILED DESCRIPTION OF THE EMBODIMENTS

Figure 1:
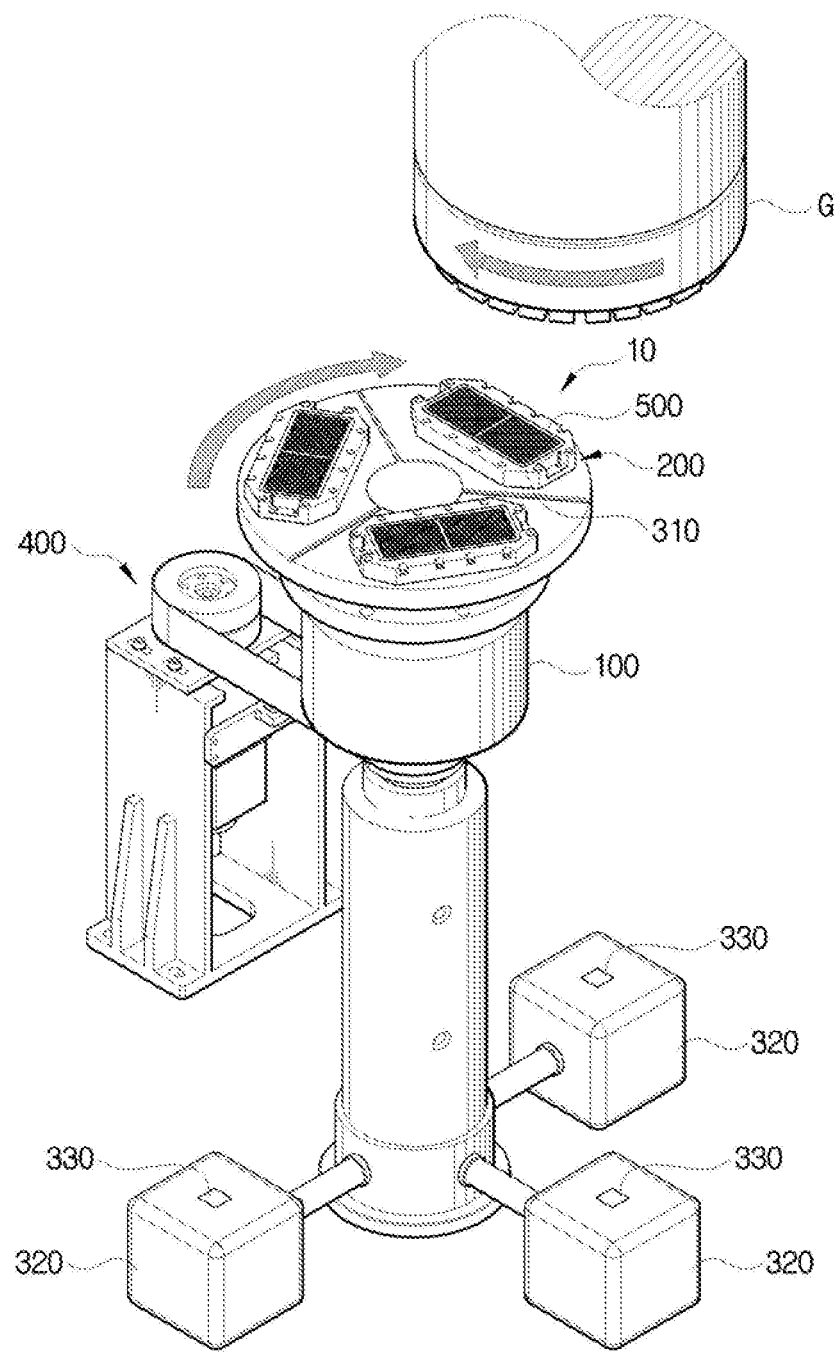
FIG. 1 is a perspective view showing a grinding equipment according to an embodiment of the present invention.
Figure 2:
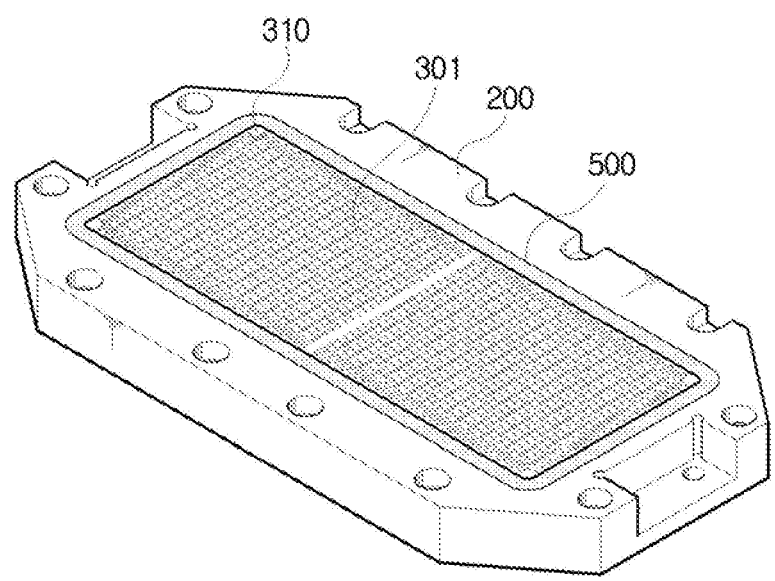
FIG. 2 is a perspective view showing a seating portion, a vacuum portion, and a lip seal part of the grinding equipment shown in FIG. 1.
Figure 3:
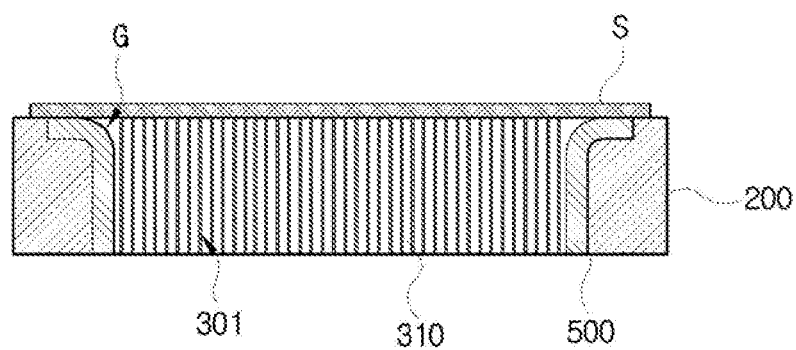
FIG. 3 is a sectional view of the seating portion, the vacuum portion, and the lip seal part shown in FIG. 2.
Figure 4:
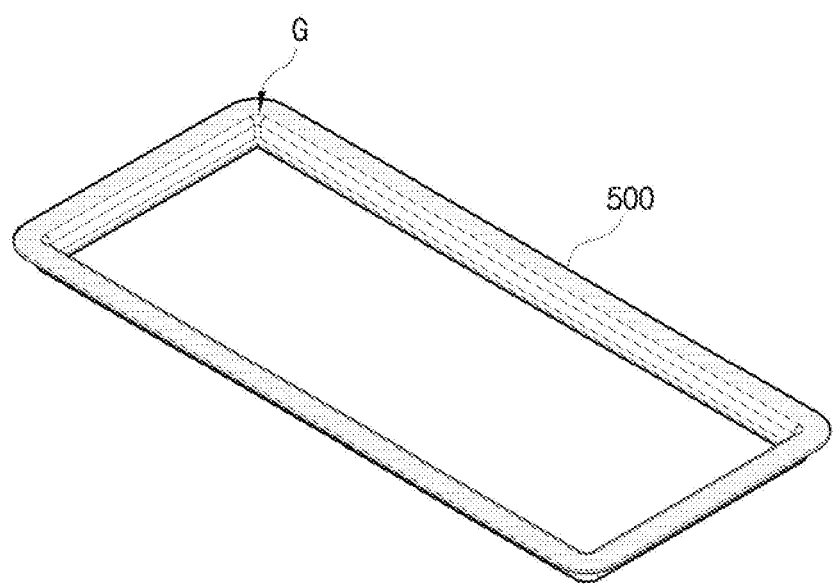
FIG. 4 is a perspective view showing the lip seal part of the grinding equipment shown in FIG. 1.

Hereinafter, preferred embodiments of the present invention will be described in detail with reference to the accompanying drawings. Prior to this, the terms or words used in the present specification and claims should not be construed as being limited to ordinary or dictionary meanings, and based on the principle that the inventor can appropriately explain the concept of terms in order to explain his or her invention in the best way, it should be interpreted as meanings and concepts consistent with the technical spirit of the present invention.

Therefore, the embodiments shown in the embodiments and drawings described in this specification are only the most preferred embodiments of the present invention, do not represent all of the technical spirit of the present invention, and at the time of this application, it should be understood that there may be equivalent variations that can be substituted.

Hereinafter, an embodiment of the present invention will be described with reference to the accompanying drawings.

With reference to FIG. 1 to FIG. 5, a grinding equipment (10) according to the embodiment of the present invention is for polishing the surface of a workpiece (S) and polishes the surface of the workpiece (S) by a polishing wheel (G) by being disposed on the lower side of the polishing wheel (G). That is, the polishing wheel (G) is provided to rotate, and the polishing wheel (G) is rotated to be in contact with one side of the workpiece (S) to polish the surface of the workpiece (S). The workpiece (S) is preferably a strip, but is not limited thereto, and other objects requiring surface polishing may be applied. The grinding equipment (10) includes a frame (100), a plurality of seating portions (200), a plurality of vacuum portions (300), a control unit (400) and a lip seal part (500).

The frame (100) is for rotating the workpiece (S) to be polished and provided to be rotated in connection with a driving motor. Therefore, the frame (100) is preferably disposed on the lower side of the polishing wheel (G), and the workpiece (S) may be disposed on the upper side of the frame (100). In other words, the frame (100) is preferably provided so that one side of the central shaft of the frame (100) and the outer circumferential surface of the polishing wheel (G) are disposed on the same line.

The plurality of seating portions (200) are to be seated on the workpiece (S), disposed on the upper side of the frame (100), and a space is formed in the central portion. That is, each of the plurality of seating portions (200) is formed to correspond to the shape of the workpiece (S) so that the workpiece (S) may be seated on the upper surface. As the plurality of seating portions (200) are provided, it is possible to simultaneously polish a plurality of workpieces (S), thereby improving manufacturing efficiency.

Figure 5:
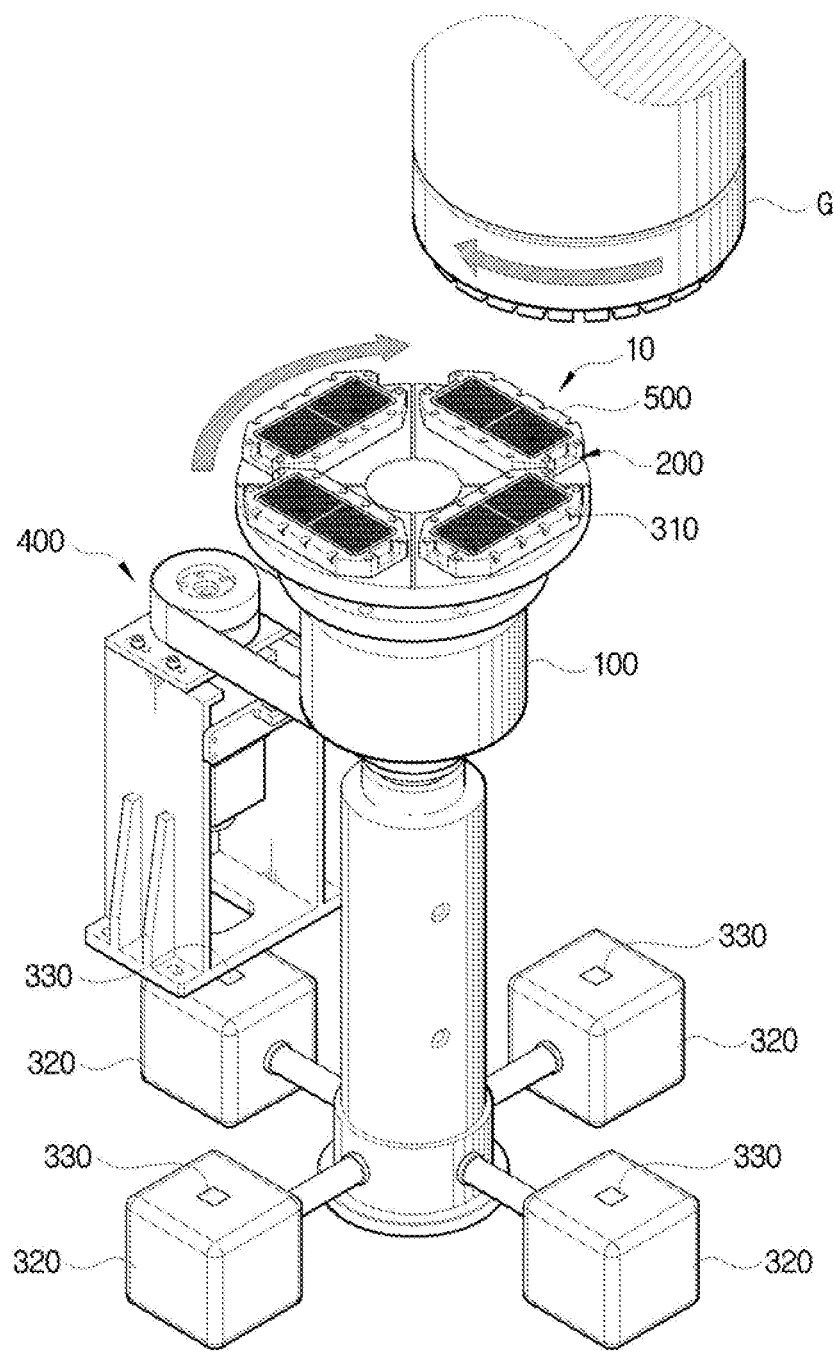
FIG. 5 is a perspective view showing another embodiment of an arrangement of a plurality of seating portions of the grinding equipment shown in FIG. 1.

On the other hand, the plurality of seating portions (200) is preferably disposed radially with respect to the central shaft of the frame (100). That is, the plurality of seating portions (200) are preferably not disposed at the central portion of the frame (100) and are preferably spaced apart from each other at the same distance along the outer circumference of the frame (100). By not disposing the workpiece (S) at the central portion of the frame (100), when the polishing wheel (G) polishes the workpiece (S), it is possible to prevent the pattern from being formed on the work piece (S) due to the difference in the polishing speed, and it is possible to perform uniform polishing and improve polishing efficiency by minimizing the difference in the polishing speed applied on the plurality of workpieces (S). In FIG. 1, the plurality of seating portions (200) are shown so as to be provided radially three based on the center of the frame (100), but are not limited thereto, and as shown in FIG. 5, four seating portions may be arranged except the central portion of the frame (100), and the number of the plurality of seating portions (200) may be appropriately changed and applied according to the size and shape of the workpiece (S).

The plurality of vacuum portions (300) are for fixing the workpiece (S) on the upper surface of the seating portion (200) by adsorbing the workpiece (S), are provided with a number corresponding to the number of the plurality of seating portions (200), and respectively disposed at the central portion of the plurality of seating portions (200). Each of the plurality of vacuum portions (300) may include a vacuum frame (310), a vacuum pump (320), and a vacuum control unit (330).

The vacuum frame (310) is disposed on the central portion of the seating portion (200) such that the workpiece (S) may be seated on the upper surface of the vacuum frame (310). That is, the vacuum frame (310) is formed with a shape corresponding to the central portion of the seating portion (200). In other words, the vacuum frame (310) is preferably provided to be disposed on each of the plurality of seating portions (200), and each of the plurality of workpieces (S) may be seated on the upper surface of a plurality of vacuum frames (310). The vacuum frame (310) includes a plurality of flow channels (301), air is sucked through the plurality of flow channels (301). Therefore, the workpiece (S) may be stably fixed to the upper surface of the vacuum frame (310) by a suction force sucked through the plurality of flow channels (301).

The vacuum pump (320) enables the flow channel (301) to a vacuum state by using a pump. That is, the vacuum pump (320) is connected to the flow channel (301) to suck and compress gas in the flow channel (301) to maintain the flow channel (301) at a predetermined appropriate press, and the workpiece (S) may be fixed on the upper surface of the seating portion (200) by forming the flow channel (301) in the vacuum state. In other words, a plurality of the vacuum pumps (320) may be provided corresponding to the number of the vacuum frames (310), and the vacuum pump (320) is connected to each of the plurality of vacuum frames (310) such that the flow channel (301) of each vacuum frame (310) is preferably formed in the vacuum state.

The vacuum control unit (330) is for controlling the vacuum pump (320) and controls the operation of the vacuum pump (320) by being connected to the vacuum pump (320). That is, the vacuum control unit (330) may adjust the flow channel (301) to maintain an appropriate pressure value at which the workpiece (S) can be fixed, by controlling the operation of the vacuum pump (320) corresponding to the pressure in the flow channel (301). In other words, a plurality of the vacuum control units (330) may be provided corresponding to the number of the plurality of vacuum frames (310), and the workpiece (S) fixed to the plurality of seating portions (200) may be individually fixed and removed by controlling each of the vacuum pumps (320) connected to the plurality of vacuum frames (310). That is, the vacuum control unit (330) adjusts the fixing force of each workpiece (S) fixed to the plurality of seating portions (200) such that individual removal of the plurality of workpieces (S) is easy and the plurality of workpieces (S)

may be easily fixed to and removed from the seating portion (200) without a separate bonding process such that it is possible to improve manufacturing efficiency.

The control unit (400) controls the rotational drive of the frame (100). That is, it is possible to rotate the plurality of workpieces (S) at the same time by rotating the frame (100) by the control unit (400). The control unit (400) may control the rotation speed, time, and the like according to the size and shape of the workpiece (S), and the control unit (400) may be configured to control the rotational drive of the frame (100) by including a driving motor and a reducer. The components of the control unit (400) for rotating the frame (100) are conventional technologies, and a detailed description thereof will be omitted here.

The lip seal part (500) is interposed between the seating portion (200) and the vacuum portion (300) to improve the fixing force of the workpiece (S). The lip seal part (500) is disposed so that one side is in contact with the inner circumferential surface of the seating portion (200) and the other side is in contact with the outer surface of the vacuum frame (310). In addition, the workpiece (S) may be seated on the upper surface of the lip seal part (500) in which the upper end protrudes to one side. In other words, the lip seal part (500) may be formed roundly (R) from the side so that the upper end protrudes to one side. That is, the lip seal part (500) is formed roundly (R) so that the upper end protrudes, by expanding a contact area between the upper surface of the lip seal part (500) and being in close contact with the workpiece (S), the fixing force of the workpiece (S) may be improved. In addition, the lip seal part (500) is disposed to be in contact with the outer surface of the vacuum frame (310) such that air may be prevented from leaking to the outside when the flow channel (301) is formed in the vacuum state through the vacuum portion (300). That is, since the lip seal part (500) seals the vacuum frame (310) to increase the vacuum force, and the workpiece (S) is in close contact with the seating portion (200), a precise polishing work is easy and it is possible to improve polishing efficiency.

In the grinding equipment (10) according to the present invention, since a plurality of vacuum portions (300) can fix a plurality of workpieces (S) respectively, it is possible to fix and remove the plurality of workpieces (S) without a separate bonding process, and since each of the plurality of workpieces (S) can be fixed and removed individually from the frame (100), manufacturing efficiency is high.

In addition, since the difference in polishing speed applied to the workpiece (S) is minimized, the occurrence of surface patterns due to the speed difference is prevented, and uniform polishing is possible by arranging radially the plurality of seating portions (200) on the basis of the central shaft of the frame (100), it is possible to reduce the production of defective products.

In addition, since the lip seal part (500) is interposed between the seating portion (200) and the vacuum portion (300), the vacuum force of the vacuum frame (310) is increased, and since fixing force by which the workpiece (S) is fixed to the seating portion (200) is improved by being the workpiece (S) in close contact with the seating portion (200) by increasing the contact area between the upper surface of the lip seal part (500) and the workpiece (S), it is possible to improve the polishing efficiency.

Although the present invention has been described with reference to the embodiments shown in the drawings, these are merely exemplary, and those skilled in the art will understand that various modifications and equivalent other embodiments are possible therefrom. Therefore, the true technical protection scope of the present invention should be defined by the technical spirit of the appended claims.

DESCRIPTION OF SYMBOLS

| | |
|---|---|
| 10: grinding equipment | 100: frame |
| 200: seating portion | 300: vacuum portion |
| 301: flow channel | 310: vacuum frame |
| 320: vacuum pump | 330: vacuum control unit |
| 400: control unit | 500: lip seal part |
| G: polishing wheel | S: workpiece |
| R: roundly | |

The invention claimed is:

1. A grinding equipment which is disposed below a polishing wheel so as to polish the surface of a workpiece, the grinding equipment comprising: a frame which has a central shaft disposed collinearly to one side of the polishing wheel and rotates about the central shaft; wherein a plurality of seating portions are disposed on an upper side of the frame and are arranged radially from the central shaft of the frame; wherein each of the seating portions has a space formed in a central portion of each of the seating portions and seats a workpiece on an upper surface of each of the seating portions; a vacuum portion which is connected to each of the central portions of each of the seating portions and has a plurality of flow channels so as to secure the workpiece by suctioning air through the plurality of flow channels, wherein a plurality of vacuum portions are connected to each of the central portions of each of the seating portions of the plurality of seating portions respectively; a control unit for controlling the rotation of the frame; and a lip seal part which is interposed between each of the seating portions and the vacuum portion, in which an upper end protrudes to one side and the workpiece is seated on an upper surface of the lip seal.

2. The grinding equipment according to claim 1, wherein the plurality of seating portions are spaced apart from each other at a same distance along the outer circumference of the frame on the upper side of the frame.

3. The grinding equipment according to claim 1, wherein the vacuum portion includes: a vacuum frame which is disposed on the central portion of the seating portion, a vacuum pump which is connected to the plurality of flow channels and enables the flow channels in a vacuum state, and a vacuum control unit which controls the vacuum pump.

4. The grinding equipment according to claim 1, wherein the lip seal part is provided along an outer circumference of a vacuum frame and formed roundly to protrude from the upper end to one side.

\* \* \* \* \*